(12) United States Patent
Hendricks

(10) Patent No.: US 6,878,641 B2
(45) Date of Patent: Apr. 12, 2005

(54) COMPOSITION AND CHEMICAL VAPOR DEPOSITION METHOD FOR FORMING ORGANIC LOW K DIELECTRIC FILMS

(75) Inventor: Neil H. Hendricks, Sonora, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 10/065,302

(22) Filed: Oct. 1, 2002

(65) Prior Publication Data

US 2004/0063336 A1 Apr. 1, 2004

(51) Int. Cl.$^7$ ................................................. H01L 21/31
(52) U.S. Cl. ........................ 438/758; 438/710; 526/251; 526/250
(58) Field of Search ................................ 438/758, 710; 526/250, 251

(56) References Cited

U.S. PATENT DOCUMENTS

| | | | |
|---|---|---|---|
| 5,204,314 A | | 4/1993 | Kirlin et al. |
| 5,536,323 A | | 7/1996 | Kirlin et al. |
| 5,711,816 A | | 1/1998 | Kirlin et al. |
| 6,303,733 B1 | * | 10/2001 | Lau et al. .................... 528/169 |
| 6,323,297 B1 | * | 11/2001 | Lee et al. .................... 526/251 |
| 6,445,126 B1 | * | 9/2002 | Arai et al. .................. 313/504 |
| 6,583,048 B1 | * | 6/2003 | Vincent et al. ............. 438/623 |
| 6,605,549 B1 | * | 8/2003 | Leu et al. .................... 438/758 |
| 6,605,863 B1 | * | 8/2003 | Yin et al. .................... 257/639 |
| 6,703,462 B1 | * | 3/2004 | Lee ............................ 526/242 |
| 6,716,770 B1 | * | 4/2004 | O'Neill et al. .............. 438/780 |
| 6,740,685 B1 | * | 5/2004 | Li et al. ........................ 521/52 |
| 6,761,975 B1 | * | 7/2004 | Chen et al. ................. 428/429 |
| 6,773,954 B1 | * | 8/2004 | Subramanian et al. ........ 438/99 |
| 6,780,517 B1 | * | 8/2004 | Chen et al. ................. 428/447 |

* cited by examiner

Primary Examiner—John F. Niebling
Assistant Examiner—Olivia Luk
(74) Attorney, Agent, or Firm—Margaret Chappuis; Steven Hultquist, Esq.

(57) ABSTRACT

Precursor compositions for the CVD formation of low k dielectric films on a substrate, e.g., as an interlayer dielectric for fabrication of microelectronic device structures. The precursor composition includes a gaseous mixture of (i) at least one aromatic compound, (ii) an inert carrier medium and (iii) optionally at least one unsaturated constituent that is ethylenically and/or acetylenically unsaturated The unsaturated constituent can include either (a) a compound containing ethylenic unsaturation and/or acetylenic unsaturation, or (b) an ethylenically unsaturated and/or acetylenically unsaturated moiety of the aromatic compound (i) of the precursor composition. The low k dielectric film material may be usefully employed in integrated circuitry utilizing copper metallization, to achieve low RC time constants and superior microelectronic device performance.

44 Claims, 1 Drawing Sheet

COMPOSITION AND CHEMICAL VAPOR DEPOSITION METHOD FOR FORMING ORGANIC LOW K DIELECTRIC FILMS

BACKGROUND OF THE INVENTION

1. Field of the Invention

The present invention relates generally to a composition and method for chemical vapor deposition formation of low k dielectric films.

2. Description of the Relater Art

In the field of semiconductor manufacturing, a need exists for low k organic polymer intermetal dielectrics that satisfy processing and performance criteria for sub-0.25 $\mu$m integrated circuit applications.

Currently, low k films are formed by spin-on processing using a high purity "lacquer," comprising a polymer (e.g., polyarylethers or organosilicates) dissolved in a solvent medium, that is spin-coated onto a substrate. These lacquers are commonly referred to as spin-on solutions. Spin-on processes tend to be inefficient with poor material utilization.

Such spin-on solutions have a variety of associated problems, including manufacturability, conformality of the deposited material coating, purity and shelf life issues, and problems of achieving reproducibility of film thickness and performance characteristics.

Many of the problems associated with forming low k dielectric films from spin-on solutions are avoidable by use of chemical vapor deposition (CVD) to form the dielectric film material. The CVD process is readily controllable in an efficient and reproducible manner to produce deposited films of highly uniform thickness and useful physical performance properties. In addition, CVD-produced films are highly conformal in character, thereby avoiding the need for an edge bead removal process and a backside rinse process that is typically required when spin-on coatings of dielectric material are formed on a microelectronic device substrate.

Unfortunately, however, a very limited number of precursors exist for CVD formation of low k films. The polymers conventionally used in spin-on coating formulations are typically of large molecular weight, and non-volatile in character, rendering them wholly unsuitable for use in CVD processes.

SUMMARY OF THE INVENTION

The present invention provides precursor compositions for the CVD formation of low k dielectric films on a substrate, e.g., as an interlayer dielectric material for fabrication of microelectronic device structures.

As used herein, "low k" refers to a dielectric material with a value of the dielectric constant, k, below 3.0 as measured at a frequency of 1 mega-Hertz.

In one aspect, the invention relates to or compositions for CVD usage, comprising a gaseous of (i) at least one aromatic compound, (ii) an inert carrier medium and (iii) optionally at least one unsaturated constituent that is ethylenically and/or acetylenically unsaturated.

As used herein, the term "unsaturated constituent that is ethylenically and/or acetylenically unsaturated" refers to either of (a) a compound containing ethylenic unsaturation and/or acetylenic unsaturation, or (b) an ethylenically unsaturated and/or acetylenically unsaturated moiety of the aromatic compound (i) of the precursor composition. Thus, the composition may variously comprise, in alternative and illustrative embodiments: 1. an aromatic compound containing at least one ethylenically unsaturated functional group (>C=C<) in its molecular structure; 2. an aromatic compound containing at least one acetylenically unsaturated functional group (-C≡C-) in its molecular structure; 3. an aromatic compound containing at least one ethylenically unsaturated functional group >C=C<) and at least one acetylenically unsaturated functional group (-C≡C-) in its molecular structure; 4. an aromatic compound and a separate and distinct ethylenically unsaturated compound; 5. an aromatic compound and a separate and distinct acetylenically unsaturated compound; 6. an aromatic compound, in combination with a separate and distinct ethylenically unsaturated compound and a separate and distinct acetylenically unsaturated compound; 7. composition 4, in which the aromatic compound contains ethylenic but no acetylenic unsaturation; 8. composition 4, in which the aromatic compound contains acetylenic but no ethylenic unsaturation; 9. composition 4, in which the aromatic compound contains both ethylenic and acetylenic unsaturation; and 10. multiple aromatic compounds, at least one of which contains no unsaturation and at least one of which contains unsaturation, et cetera, it being recognized that many permutations and combinations of the composition exist, in which the composition includes at least one aromatic compound, as well as non-aromatic unsaturation in the form of functional group(s) or separate compound(s).

In another aspect of the invention, o composition including at least one aromatic compound as well as non-aromatic unsaturation in the form of functional group(s) or separate compound(s) is subjected to chemical vapor deposition conditions to form a low k dielectric film on a substrate. Such chemical vapor deposition conditions optionally can include plasma enhancement of the CVD process.

Other aspects, features and embodiments of the invention will be more fully apparent from the ensuing disclosure and appended claims.

DETAILED DESCRIPTION OF THE INTENTION, AND PREFERRED EMBODIMENTS THEREOF

Figure 1:
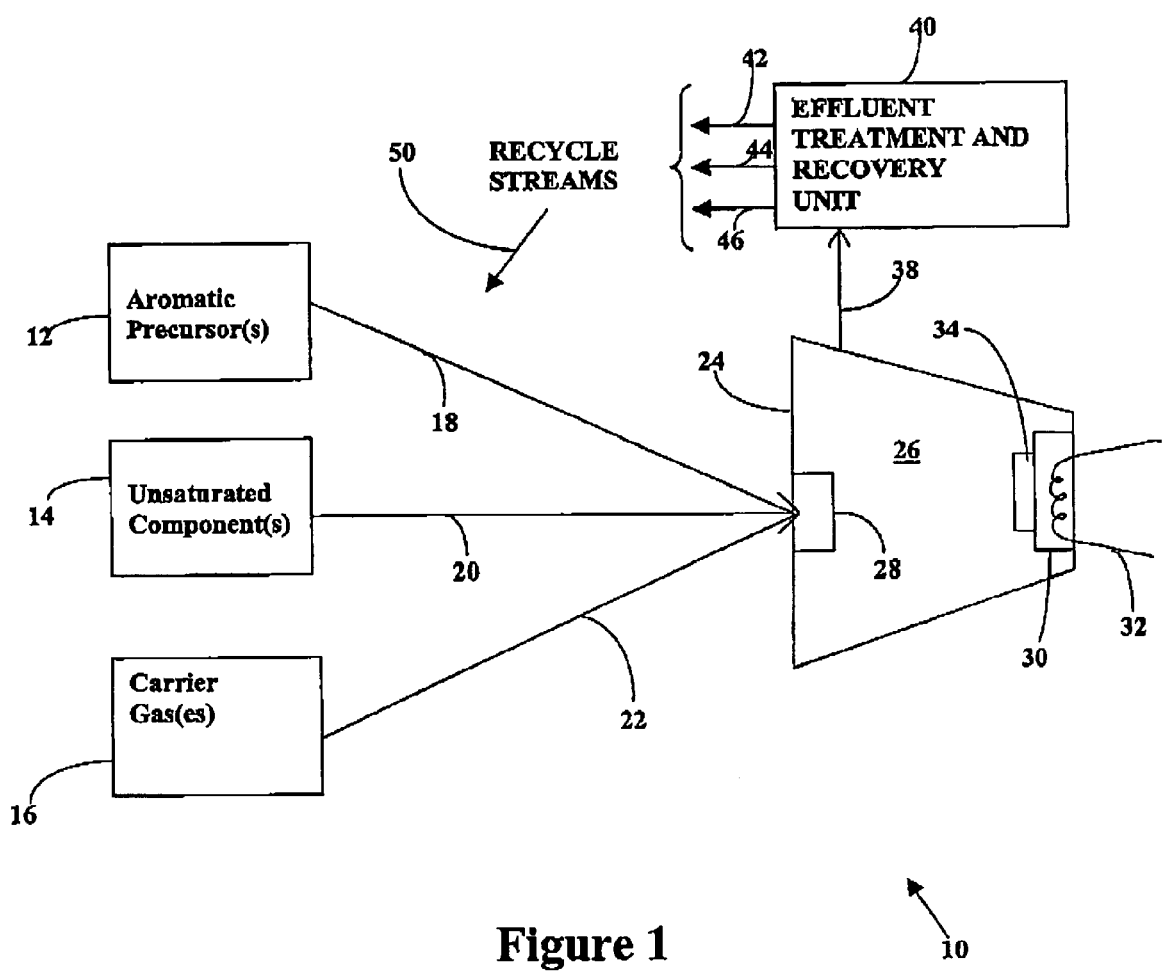
FIG. 1 is a simplified schematic representation of a process system for forming a low k dielectric film on a substrate in accordance with one embodiment of the invention.

The present invention contemplates the use of a composition for CVD formation of a low k dielectric film, in which the composition contains at last one aromatic compound as well as non-aromatic unsaturation (ethylenic and/or acetylenic unsaturation).

The aromatic compounds useful in the invention include aromatic compounds having constituent ethylenic and/or acetylenic functionality, as well as aromatic compounds that are devoid of such additional constituent ethylenic and/or acetylenic functionality, but which are used in combination with other compounds having such ethylenic and/or acetylenic functionality, in the low k dielectric film precursor composition.

The aromatic compound can be a monocylic aromatic compound, e.g. benzene, a substituted monocylic compound, such as toluene, xylene, mesitylene, cumene, cymene, etc., a polycyclic aromatic compound such as pentalene, indene, naphthalene, azulene, heptalene, biphenylene, phanalene, substituted polycylic aromatic compounds containing one or more substituents such as $C_1$-$C_8$ alkyl, fluoro, $C_1$-$C_8$ fluoroalkyl, $C_1$-$C_8$ alkoxy, and combinations thereof.

Alternatively, the aromatic compound can contain non-aromatic unsaturation, in the form of ethylenically unsaturated and/or acetylenically unsaturated moieties, e.g., functional groups such as one or more of the following:

vinyl $CH_2$=CH—
allyl $CH_2$=CH—$CH_2$—
isopropenyl $CH_2$=C($CH_3$)—
ethynyl CH≡C—
2-propynyl CH≡C—$CH_2$—
1-propenyl $CH_3$—CH=CH—
2-butenyl $CH_2$—CH=CH—$CH_2$—
1,3-butadienyl $CH_2$=CH—CH=CH—
2-pentenyl $CH_3$—$CH_2$—CH=CH—$CH_2$—
2-penten-4-ynyl CH≡C—CH=CH—$CH_2$—

Accordingly, the invention contemplates a variety of ethylenically and/pr acetylenically substituted aromatic compounds. Illustrative compounds of such type include those of the formulae:

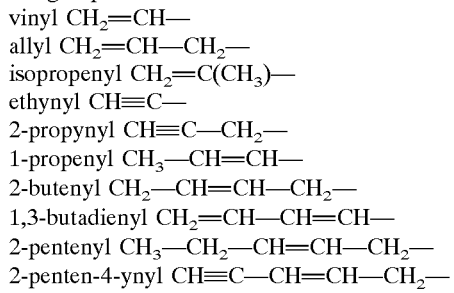

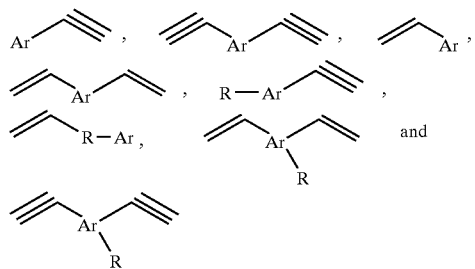

wherein Ar is an aromatic moiety (e.g., a monovalent, divalent or trivalent radical of a monocyclic or polycyclic ring structure, depending on the number of unsaturated functional groups and R groups attached to the ring), such as benzene, naphthalene. pentalene, indene, azulene, heptalene, biphenyl, triphenyl, biphenylene, phenalene, propacene, butacene, etc.

Ar preferably includes 5- and 6- carbocylic and heterocyclic aromatic rings such as thiophene rings, thiazole rings, furan rings, pyrrole rings, imidazole rings, benzene rings, quinoline rings and quinoxaline rings.

In the above formulae featuring R groups in the compound, R may be any suitable species that is compatible with the aromatic structure and provides appropriate volatility and physicochemical properties in the formation and performance of the dielectric film. Illustrative R groups include vinyl, ethynyl, methoxy, iodo, bromo, chloro, fluoro, amino, hydroxyl, nitrile, carboxyl, $C_1$-$C_8$ alkyl, $C_1$-$C_8$ fluoroalkyl and $C_1$-$C_8$ perfluroalkyl.

In various embodiments, it is desirable to incorporate oxygen atoms in the precursor composition in linking groups between aromatic rings in polynuclear aromatic compounds, and for such purpose Ar in the above formulae alternatively may be a polynuclear moiety wherein at least one pair of adjacent aromatic rings is joined by an oxo (—O—) group, or a carbonyl (—C(O)—) group. The R groups in such case, in addition to the aformentioned R group species, may alternatively be an aryloxy or polyaryloxy substituent, such as —O—Ph, —O—BiPh, —O—Ph—O—Ph, etc., wherein Ph is phenyl and BiPh is biphenyl.

The presence of oxygen atoms in the precursor composition in linking groups between adjacent aromatic rings increases the molecular weight of the product film and may significantly improve it toughness and other physical properties.

In other embodiments of the dielectric film precursor composition, aromatic monomers of the variously aforementioned types can be used, in combination with ethylenically unsaturated compounds and/or acetylenically unsaturated compounds, wherein the unsaturated compound(s) function as cross-linking agents for the composition, and thereby improve the hardness of the product dielectric film.

Illustrative of such cross-linkable compositions are the following reagent combinations:

(1) Ar—C≡CH and HC≡CH wherein each of the aromatic and acetylene compounds is independently present in an amount of 1–50% by volume based on the total volume of such compounds, and wherein the total volume of the compounds equals 100%;

(2) HC≡C—Ar—C≡CH, wherein each of the aromatic and acetylene compounds is independently present in an amount of 1–50% by volume, based on the total volume of such compounds, and wherein the total volume of the compounds equals 100%;

(3) HC≡C—Ar(R)—C≡CH and $H_2C$=$CH_2$, wherein R is as previously described, each of the aromatic and ethylene compounds is independently present in an amount of 1–50% by volume, based on the total volume of such compounds, and wherein the total volume of the compounds equals 100%.

The compositions of the invention are usefully employed to form low k dielectric films on substrates by chemical vapor deposition.

In one embodiment (hereinafter referred to as "Embodiment 1") a low k dielectric material precursor composition comprising from about 1 to about 99% by volume of an aromatic compound and from about 1 to about 99% by volume of an inert carrier gas, based on the total volume of the aromatic compound and inert carrier gas, is subjected to plasma-enhanced chemical vapor deposition (PECVD) conditions in a plasma chamber containing a substrate, so that the precursor composition in plasma form is contacted with the substrate in the plasma chamber to deposit a low k dielectric film on the substrate.

In another embodiment (hereinafter referred to as "Embodiment 2"), a low k dielectric material precursor composition comprising from about 1 to about 99% by volume of (1) an aromatic compound and from about 1 to about 99% by volume of (2) acetylene or ethylene gas, based on the total volume of the aromatic compound and ethylene/acetylene gas, is mixed with (3) a carrier gas, e.g., having a volume of from about 1 to about 99% by volume, based on the total volume of the aromatic compound and ethylene/acetylene gas, is subjected to plasma-enhanced chemical vapor deposition (PECVD) conditions in a plasma chamber containing a substrate, so that the precursor composition in plasma form is contacted with the substrate in the plasma chamber to deposit a low k dielectric film on the substrate.

In yet another embodiment, a low k dielectric material precursor composition, as in either of Embodiment 1 or Embodiment 2, is subjected to chemical vapor deposition (CVD) conditions in a CVD chamber containing a substrate, wherein the CVD conditions include temperature in the chamber in a range of from about 50° C. to about 500° C. and more preferably in a range of from about 250° C. to about 400° C., so that the precursor composition is thermally disassociated to deposit a low k dielectric film on the substrate.

The inert carrier gas in the process can be of any suitable type, e.g., argon, helium, krypton, xenon, etc.

Specific CVD conditions are readily determinable for a given application by empirically varying the process conditions (e.g., pressure, temperature, flow rate, relative proportions of the aromatic compound and inert carrier gas in the composition, etc.) and developing correlation to the dielectric film properties produced in the process.

Particularly preferred aromatic compounds having pendent unsaturated (ethylenic or acetylenic) functionality, include phenylacetylene and phenylethylene.

Referring now to the drawing, FIG. 1 is a schematic representation of a process system 10 for forming a low k dielectric film on a substrate in accordance with one embodiment of the invention.

In process system 10, a source 12 of aromatic precursor(s) is joined by line 18 to disperser 28 in CVD reactor 24. The CVD reactor may be constructed and arranged to carry out CVD involving thermal dissociation of the precursor vapor to deposit the desired low k dielectric film on the substrate 34 mounted on susceptor 30 heated by heating element 32. Alternatively, the CVD reactor may be constructed and arranged for carrying out plasma-enhanced CVD, by ionization of the precursor gas mixture.

System 10 also includes a source 14 of unsaturated component(s), e.g., ethylenically unsaturated compound(s) and/or acetylenically unsaturated compound(s), such as ethylene and/or acetylene. The source 14 is joined by line 20 to the disperser 28 in CVD reactor 24.

A source 16 of carrier gases is also provided, joined by line 22 to the disperser 28 in CVD reactor 24.

The disperser 28 may comprise a showerhead nozzle, jet or the like which functions to receive and mix the feed streams from the respective sources 12, 14 and 16, to form a gaseous precursor mixture which then is flowed toward the substrate 34 on the heated susceptor 30. The substrate 34 may be a silicon wafer or other substrate element and material, on which the low k dielectric film is deposited.

In lieu of mixing the respective feed streams from lines 18, 20 and 22 in the disperser, the streams may be combined in a mixing vessel or chamber upstream of the CVD reactor 24. Further, it will be appreciated that if the CVD reactor is configured and operated for carrying out PECVD, a plasma generator unit may be provided as part of or upstream of the CVD reactor 24.

The feed streams from sources 12, 14 and 16 may be monitored in lines 18, 20 and 22, respectively, by means of suitable monitoring devices (not shown in FIG. 1), and the flow rates of the respective streams may be independently controlled (by means such as mass flow controllers, pumps, blowers, flow control valves, regulators, restricted flow orifice elements, etc., also not shown) to provide a combined precursor feed stream having a desired compositional character.

The precursor formulations of the invention may be employed in any suitable chemical vapor deposition system to form corresponding thin films on a substrate or microelectronic device precursor structure as a dielectric layer thereon. The CVD system may for example comprise a liquid delivery CVD system, a bubbler-based CVD system, or a CVD system of any other suitable type. Suitable liquid delivery CVD systems include those disclosed in Kirlin et al, U.S. Pat. No. 5,204,134; Kirlin et al. U.S. Pat. No. 5,536, 323; and Kirlin et. al. U.S. Pat. No. 5,711,816.

In liquid delivery CVD, the source liquid may comprise the source reagent compound(s) or complex(es) per se, if the compound(s) or complex(es) are in the liquid phase at ambient temperature (e.g., room temperature, 25° C.) or otherwise at the supply temperature from which the source reagent is rapidly heated and vaporized to form precursor vapor for the CVD process. Alternatively, if the source reagent compound or complex is a solid at ambient or the supply temperature, such compound(s) or complexes(es) can be dissolved or suspended in a compatible solvent medium to provide a liquid phase composition that can be submitted to rapid heating and vaporization to form precursor vapor for the CVD process. The precursor vapor resulting from the vaporization then is transported, optionally in combination with a carrier gas (e.g., He, Ar, $H_2$, $O_2$, etc.), to the chemical vapor deposition reactor where the vapor is contacted with a substrate at elevated temperature to deposit material from the vapor phase onto the substrate or semiconductor device precursor structure positioned in the CVD reactor.

In addition to flash vaporizer liquid delivery systems, other reagent delivery systems such as bubblers and heated vessels can be employed. In bubbler-based delivery systems, an inert carrier gas is bubbled through the precursor composition to provide a resulting fluid stream that is wholly or partially saturated with the vapor of the precursor composition, for flow to the CVD tool.

Accordingly, any method that delivers the precursor composition to the CVD tool may be usefully, employed.

With respect to the specific temperatures, pressures, flow rates and concentrations of specific precursor components, a wide variety of CVD process conditions may be employed for forming low k dielectric films on substrates, in accordance with the present invention, Such conditions are readily determinable within the skill of the art, based on the disclosure of the invention herein, to form low k-dielectric films having desired properties.

Although the invention has been variously disclosed herein with reference to illustrative aspects, embodiments and features, it will be appreciated that the aspects, embodiments and features described hereinabove are not intended to limit the invention, and that other variations, modifications and other embodiments will suggest themselves to those of ordinary skill in the art. The invention therefore is to be broadly construed, consistent with the claims hereinafter set forth.

What is claimed is:

1. A precursor composition for CVD formation of low k dielectric films, said composition comprising a gaseous mixture of (i) at least aromatic compound, (ii) an inert carrier medium and (iii) optionally at least one unsaturated constituent that is ethylenically and/or acetylenically unsaturated.

2. The composition of claim 1, comprising said at least one unsaturated constituent that is ethylenically and/or acetylenically unsaturated.

3. The composition of claim 2, wherein at least one unsaturated constituent that is ethylenically and/or acetylenically unsaturated, comprises at least one compound that is separate and distinct from said at least one aromatic compound.

4. The composition of claim 2, wherein said at least one unsaturate constituent that is ethylenically and/or acetylenically unsaturated, comprises a moiety of said at least one aromatic compound.

5. The composition of claim 1, comprising an aromatic compound containing at least one ethylenically unsaturated functional group (>C=C<) in its molecular structure.

6. The composition of claim 1, comprising an aromatic compound containing at least one acetylenically unsaturated functional group (—C≡C—) in its molecular structure.

7. The composition of claim 1, comprising an aromatic compound containing at least one ethylenically unsaturated functional group (>C=C<) and at least one acetylenically unsaturated functional group (—C≡C—) in its molecular structure.

8. The composition of claim 1, comprising an aromatic compound and a separate and distinct ethylenically unsaturated compound.

9. The composition of claim 1, comprising an aromatic compound and a separate and distinct acetylenically unsaturated compound.

10. The composition of claim 1, comprising an aromatic compound, in combination with a separate and distinct ethylenically unsaturated compound, in combination with a separate and distinct ethylenically unsaturated compound and a separate and distinct acetylenically unsaturated compound.

11. The composition of claim 1, comprising an aromatic compound that contains no thylenic or acetylenic unsaturation.

12. The composition of claim 1, comprising an aromatic compound that contains ethylenic but no acetylenic unsaturation.

13. The composition of claim 1, comprising an aromatic compound that contains acetylenic but no ethylenic unsaturation.

14. The composition of claim 1, comprising an aromatic compound that contains both ethylenic and acetylenic unsaturation.

15. The composition of claim 1, comprising an aromatic compound that contains multiple aromatic compounds, at least one of which contains no unsaturation, and at least one of which contains at least one of ethylenic and acetylenic unsaturation.

16. The composition of claim 1, comprising a monocyclic aromatic compound.

17. The composition of claim 1, comprising benzene.

18. The composition of claim 1, comprising a substituted monocyclic compound.

19. The composition of claim 1, comprising at least one of toluene, xylene, mesitylene, cumene, and cymene.

20. The composition of claim 1, comprising a polycyclic aromatic compound.

21. The composition of claim 1, comprising at least one of pentalene, indene, naphthalene, azulene, heptalene, biphenylene, and phenalene.

22. The composition of claim 1, comprising at least one substituted polycyclic aromatic compound containing one or more substituents independently selected from $C_1$-$C_8$ alkyl, fluoro, $C_1$-$C_8$ fluoroalkyl, $C_1$-$C_8$ alkoxy, and combination thereof.

23. The composition of claim 1, comprising non-aromatic unsaturation, in the form of ethylenically unsaturated and/or acetylenically unsaturated moieties, including at least one of the following:

vinyl $CH_2$=CH—
allyl $CH_2$=CH—$CH_2$—
isopropenyl $CH_2$=C($CH_3$)—
ethynyl CH≡C—
2-propynyl CH≡C—$CH_2$—
1-propenyl $CH_3$—CH=CH—
2-butenyl $CH_2$—CH=CH—$CH_2$—
1,3-butadienyl $CH_2$=CH—CH=CH—
2-pentenyl $CH_3$—$CH_2$—CH=CH—$CH_2$—
2-penten-4-ynyl CH≡C—CH=CH—$CH_2$—.

24. The composition of claim 1, comprising at least one ethylenically and/or acetylenically substituted aromatic compound, selected from those of the formulae:

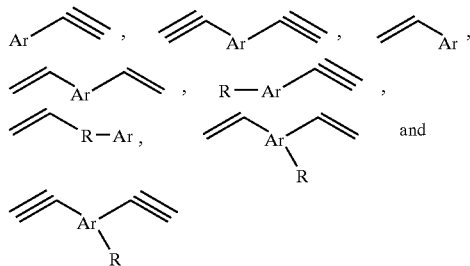

wherein Ar is an aromatic moiety and R is selected from vinyl, aryloxy, polyaryloxy, ethynyl, methoxy, iodo, bromo, chloro, fluoro, amino, hydroxyl, nitrile, carboxyl, $C_1$-$C_8$ alkyl, $C_1$-$C_8$ fluoroalkyl and $C_1$-$C_8$ perfluoroalkyl.

25. The composition of claim 24, Ar is a monovalent, divalent or trivalent radical of a monocyclic or polycyclic ring structure.

26. The composition of claim 25, wherein said ring structure is selected from benzene, naphthalene, pentalene, indene, azulene, heptalene, biphenyl, triphenyl, biphenylene, phenalene, propacene and butacene.

27. The composition of claim 24, wherein Ar is selected from 5- and 6-member carbocyclic and heterocyclic aromatic rings.

28. The composition of claim 24, wherein Ar is selected from thiophene rings, thiazole rings, furan rings, pyrrole rings, imidazole rings and benzene rings.

29. The composition of claim 24, wherein Ar is a polynuclear moiety wherein at least one pair of adjacent aromatic rings is joined by an oxo (—O—) group, or a carbonyl (—C(O)—) group.

30. The composition of claim 24, wherein R is aryloxy or polyaryloxy.

31. The composition of claim 24, wherein R is selected from —O—Ph, —O—BiPh, and —O—Ph—O—Ph, wherein Ph is phenyl and BiPh is biphenyl.

32. The composition of claim 1, comprising one of the following:

Ar—C≡CH and HC≡CH, wherein each of the aromatic and acetylene compounds is independently present in an amount of 1–50% by volume, based on the total volume of such compounds, and wherein the total volume of the compounds equals 100%;

HC≡C—Ar—C≡CH and HC≡CH, wherein each of the aromatic and acetylene compounds is independently present in an amount of 1–50% by volume, based on the total volume of such compounds, and wherein the total volume of the compounds equals 100%; and HC≡C—Ar(R)—C≡CH and $H_2C$=$CH_2$, wherein R is as previously described, each of the aromatic and ethylene compounds is independently present in an amount of 1–50% by volume, based on the total volume of such compounds, and wherein the total volume of the compounds equals 100%.

33. The composition of claim 1, comprising at least one of phenylacetylene and phenylethylene.

34. A method of a low k dielectric film on a substrate by CVD from a precursor subjected to CVD conditions, said method comprising using as said precursor a precursor composition comprising a gaseous mixture of (i) at least one aromatic compound, (ii) an inert carrier medium and (iii) optionally at least one unsaturated constituent that is ethylenically and/or acetylenically unsaturate.

35. The method of claim 34, wherein said CVD conditions include plasma enhancement of the CVD.

36. A method of forming a low k dielectric film on a substrate by CVD from a precursor subjected to CVD conditions, said method comprising using as said precursor a precursor composition including at least one aromatic compound as well as non-aromatic unsaturation in the form of functional group(s) or separate compound(s).

37. The method of claim 36, wherein said CVD conditions include plasma enhancement of the CVD.

38. A method of forming a low k dielectric film on a substrate by CVD from a precursor subjected to CVD conditions, said method comprising using as said precursor a precursor composition including at least one aromatic monomer, and at least one unsaturated compound selected from ethylenically unsaturated compounds and acetylenically unsaturated compounds, wherein said at least one unsaturated compound is a cross-linking agent for the aromatic monomer.

39. The method of claim 38, wherein said precursor composition comprises one of the following:

Ar—C≡CH and HC≡CH, wherein each of the aromatic and acetylene compounds is independently present in an amount of 1–50% by volume, based on the total volume of such compounds, and wherein the total volume of the compounds equals 100%;

HC≡C—Ar—C≡CH and HC≡CH, wherein each of the aromatic and acetylene compounds is independently present in an amount of 1–50% by volume, based on the total volume of such compounds, and wherein the total volume of the compounds equals 100%; and HC≡C—Ar(R)—C≡CH and $H_2C=CH_2$, wherein R is as previously described, each of the aromatic and ethylene compounds is independently present in an amount of 1–50% by volume, based on the total volume of such compounds, and wherein the total volume of the compounds equals 100%.

40. A method of forming a low k dielectric film on a substrate by CVD from a precursor subjected to CVD conditions, said method comprising using as said precursor a precursor composition including from about 1 to about 99% by volume of an aromatic compound and from about 1 to about 99% by volume of an inert carrier gas, based on the total volume of the aromatic compound and inert carrier gas, and wherein said CVD conditions comprise plasma-enhanced chemical vapor deposition (PECVD) conditions in a plasma chamber containing a substrate, so that the precursor composition in plasma form is contacted with the substrate in the plasma chamber to deposit a low k dielectric film on the substrate.

41. A method of forming a low k dielectric film on a substrate by CVD from a precursor subjected to CVD conditions, said method comprising using as said precursor a precursor composition including from about 1 to about 99% by volume of (1) an aromatic compound and from about 1 to about 99% by volume (2) acetylene or ethylene gas, based on the total volume of the aromatic compound and ethylene/acetylene gas, together with (3) a carrier gas, having a volume of from about 1 to about 99% by volume, based on the total volume of the aromatic compound and ethylene/acetylene gas, wherein said CVD conditions comprise plasma-enhanced chemical vapor deposition (PECVD) conditions in a plasma chamber containing a substrate, so that the precursor composition in plasma form is contacted with the substrate in the plasma chamber to deposit a low k dielectric film on the substrate.

42. A method of forming a low k dielectric film on a substrate by CVD from a precursor subjected to CVD conditions, said method comprising using as said precursor a precursor composition selected from (I) and (II):

(I) a precursor composition including from about 1 to about 99% by volume of an aromatic compound and from about 1 to about 99% by volume of an inert carrier gas, based on the total volume of the aromatic compound and inert carrier gas; and (II) a precursor composition including from about 1 to about 99% by volume of (1) an aromatic compound and from about 1 to about 99% by volume of (2) acetylene or ethylene gas, based on the total volume of the aromatic compound and ethylene/acetylene gas, together with (3) a carrier gas, having a volume of from about 1 to about 99% by volume, based on total volume of the aromatic compound and ethylene/acetylene gas, wherein the CVD conditions include temperature in a range of from about 50°C. to about 500°C. so that the precursor composition is thermally dissociated to deposit a low k dielectric film on the substrate.

43. The method of claim 42, wherein the inert carrier gas is selected from argon, helium, krypton and xenon.

44. The method of claim 42, wherein the precursor composition comprise at least one of phenylacetylene and phenylethylene.

* * * * *